United States Patent [19]

Afzali-Ardakani et al.

[11] Patent Number: 4,800,397
[45] Date of Patent: Jan. 24, 1989

[54] METAL TRANSFER TO FORM PRINTING MASTER PLATE OR PRINTED CIRCUIT BOARD

[75] Inventors: Ali Afzali-Ardakani, White Plains; Mukesh Desai, Fishkill, both of N.Y.; Bradford J. Factor, Palto Alto, Calif.; Jan-Pieter Hoekstra, Carmel; Keith S. Pennington, Somers, both of N.Y.

[73] Assignee: International Business Machines Corporation, Armonk, N.Y.

[21] Appl. No.: 115,471

[22] Filed: Oct. 30, 1987

[51] Int. Cl.⁴ .................................................. G01D 9/00
[52] U.S. Cl. .................. 346/1.1; 346/76 PH; 346/76 R; 29/846; 156/901; 156/905
[58] Field of Search ............... 346/76 PH, 76 R, 1.1; 29/846; 156/901, 905

[56] References Cited

U.S. PATENT DOCUMENTS 4,614,837  9/1986  Kane et al. .......................... 29/846

Primary Examiner—E. A. Goldberg
Assistant Examiner—Huan H. Tran
Attorney, Agent, or Firm—Sughrue, Mion, Zinn, Macpeak & Seas

[57] ABSTRACT

An improved apparatus and process are described in which metal images are transferred to a softenable receiving layer using commercially available multi-stylus recording heads. The transfer medium is comprised of a resistive layer and a thin metal layer thereon. Electrical currents are provided by the recording styli of the multi-stylus recording head. Localized electrical currents in the resistive layer provide sufficient heat in the metal layer to soften regions of a metable receiving layer when it is brought into contact with said heated metal layer. Metal imaging for use in printed circuit board manufacture and in formation of printing masters can be transferred by this technique.

21 Claims, 1 Drawing Sheet

METAL TRANSFER TO FORM PRINTING MASTER PLATE OR PRINTED CIRCUIT BOARD

FIELD OF THE INVENTION

This invention relates to printing techniques and apparatus and more particularly to the production of printed circuit boards and offset masters characterized by transferred metal imaging or metal pattern by a technique involving transfer of metal from a resistive ribbon.

BACKGROUND ART

Both resistive ribbon thermal transfer printing and electroerosion printing are known in the art for providing high resolution, good quality printing, especially of the type that is used in computer terminals and typewriters. Resistive ribbon thermal transfer printing is a type of thermal printing in which a thin ribbon is used. The ribbon is generally comprised of either three or four layers, including a support layer, a layer of fusible ink that is brought into contact with the receiving medium (such as paper), and a layer of electrically resistive material. In a variation, the resistive layer is thick enough to be the support layer, so that a separate support layer is not needed. A thin, electrically conductive layer is also optionally provided to serve as a current return.

In order to transfer ink from the fusible ink layer to the receiving medium, the layer of ink is brought into contact with the receiving surface. The ribbon is also contacted by an electrical power supply and selectively contacted by a thin printing stylus at those points opposite the receiving surface (paper) where it is desired to print. When current is applied via the thin printing stylus, it travels through the resistive layer and causes localized resistive heating, which in turn melts a small volume of ink in the fusible ink layer. This melted ink is then transferred to the receiving medium to produce printing. Resistive ribbon thermal transfer printing is described in U.S. Pat. Nos. 3,744,611; 4,309,117; 4,400,100; 4,491,431; and 4,491,432.

The materials used in resistive printing ribbons are well known in the art. For example, the resistive layer is commonly a carbon or graphite-filled polymer, such as polycarbonate. The thin current return layer is a metal, such as Al. The thermally fusible inks are comprised of various resins havig a colorant therein, and typically melt at about 100 degrees C. Printing currents of approximately 20–30 mA are used in the present, commercially available printers, such as those sold by IBM Corporation under the name QUIETWRITER™.

Electroerosion printing is also well known in the art, as exemplified by U.S. Pat. Nos. 3,786,518; 3,861,952; 4,339,758; and 4,086,853. Electroerosion printing is known as a technique which is suitable to make direct offset masters and direct negatives. Generally, the electroerosion recording medium is comprised of a support layer and a thin conductive layer. The support layer can be, for example, paper, polyesters such as Mylar™, etc., while the thin conductive layer is a metal, such as Al. In order to print, portions of the thin Al layer are removed by an electric arc. To do so, a printing head comprising multiple styli, typically tungsten wire styli of diameters 0.3–0.5 mil, is swept across the electroerosion medium while maintaining good electrical contact between the styli tips and the aluminum layer. When an area is to be printed, a pulse is applied to the appropriate styli at the correct time, resulting in an arc between the energized styli and the aluminum layer. This arc is hot enough to cause local removal of the aluminum by disintegration, e.g., vaporization.

Practical electroerosion media require a base layer between the supporting substrate and the thin metal layer, as well as an overlayer on the thin metal layer. The base layer and the overlayer are used to prevent scratching of the aluminum layer in areas where no arc is applied, and to minimize head wear and fouling. Typically, the base layer is a hard layer consisting of hard particles embedded in a suitable binder, such as silica in a cross-linked cellulosic binder. The overlayer is typically a lubricating, protective overlayer comprised of a polymer including a solid lubricant, such as graphite in a cellulosic binder.

Depending upon the properties of the various layers in the electroerosion medium, direct offset masters and direct negatives can be formed. For example, a direct negative can be comprised of a transparent polymer support layer and a thin aluminum layer directly deposited on the support layer. After electroerosion writing the Al layer is patterned. Since the Al layer is reflective to light while the substrate is transparent, the electroerosion writing has produced the required light opaque and light transparent regions needed to make a negative. The electroeroded negative can be used in a platemaking machine of the type used to make a "master", such as that used in offset photolithography. The master would be made by contact printing using the electroeroded negative.

A direct master can be easily made by electroerosion in order to simplify the process by which masters or plates, are made in conventional offset lithography shops. In such a structure, the electroerosion recording medium is typically comprised of the support layer, a base layer which is hydrophobic, an Al layer, and an optional overlayer. When the Al layer is electroeroded and the overlayer removed, regions of the Al layer (unwritten areas) and the base layer (written areas) will be exposed. Since the Al layer is hydrophilic, the unwritten areas having Al will attract water but repel organic inks. The written areas of the recording medium, being comprised of the hydrophobic base layer, will repel water but will accept organic based inks. A direct master is thereby produced, since the information to be printed has been successfully mapped onto the master in terms of surface affinity to water and ink.

If the problem of scratching of the Al layer in undesired areas were not present, the substrate Al layer combination could itself be used for direct master and direct negative applications. For a direct negative, a clear polymer sheet, typically polyester, can be used as the substrate. Since this is transparent to light while the Al is reflective, a direct negative would be obtained. Also, since the Al is hydrophilic and the polyester substrate is hydrophobic, a direct master would also be created in principle.

Heretofore, electroerosion has been used to provide lithographic printing masters, but the lifetimes of these masters in actual use is not as extensive as when the traditional printing plates, or masters, are made using various chemical treatments to prepare a photosensitized plate.

Printed circuit boards require formation of a conductive metal pattern on an insulating substrate. Various methods for preparing such products are known in the art. However, the general procedures employed involve photoresist and metal etching, i.e., through the use of photoresist areas not to be etched followed by removal of remaining resist by a solvent treatment. Numerous steps are involved to achieve formation of an initial metal pattern.

Generally, the prior art has not provided a technique for creating offset masters or patterned boards for printed circuit applications using equipment which is energy efficient and suitable for processing using commercially available apparatus.

SUMMARY OF THE INVENTION

Accordingly, it is a primary object of this invention to provide an improved technique for transferring metal images onto a substrate.

It is another object of this invention to provide a process for transferring a metal pattern onto an insulating substrate in an overall printed circuit board manufacturing process.

Still another object of this invention is to provide an improved technique for producing masters and printed circuit boards requiring metal patterns without the need for electroerosion processing or the need for photoresist-metal deposition processing.

It is another object of this invention to provide a process whereby low levels of electical energy are used to directly effect a transfer of metal images to a receiver substrate.

It is yet another object of this invention to provide a metal image transfer technique providing good resolution through use of modified resistive ribbon thermal transfer materials and processes.

It is another object of this invention to provide an improved metal image transfer technique where resistive ribbon transfer printing equipment can be employed.

Other objects of the present invention will be apparent to the skilled artisan from the Detailed Description of the Invention hereinbelow.

Accordingly, the present invention provides a method for transferring metal images to a heat softenable, i.e., heat meltable or heat fusible, receiving substrate comprising applying electrical current pulses through selected recording styli of a multi-stylus recording head located in contact with a resistive layer of a resistive ribbon for thermal transfer printing comprising said resistive layer and a metal layer, the affinity of said metal layer for said receiving substrate being greater than the affinity of said metal for said resistive layer, whereby metal imagery is transferred to said receiving substrate upon said electrical currents providing sufficient resistive heating in the regions of said metal layer about coextensive with said receiving substrate to soften said about coextensive regions of said receiving substrate.

In a preferred embodiment of the present invention, the receiving substrate comprises a printed circuit insulating board.

In another embodiment of the present invention, the receiving substrate is comprised of a metal plate coated with a thin layer of hydrophilic meltable polymer onto which the said metal from the resistive ribbon is transferred, whereby a master plate for offset printing results.

In another embodiment of the present invention, the receiving substrate comprises a metal plate coated with a thin layer of heat fusible hydrophilic polymer, onto which said metal from the resistive ribbon is transferred, whereby a master plate for offset printing results.

In another preferred embodiment of this invention, the receiving substrate is coated with a high temperature adhesive.

In still another preferred embodiment of this invention, the metal imagery that is transferred comprises a dual layer consisting of two different metals.

DETAILED DESCRIPTION OF THE INVENTION

In this invention, a multi-stylus printing head, of the type used in resistive ribbon printing or electroerosion printing, is used to provide localized currents in a resistive layer of a thermal metal transfer medium. The transfer medium is comprised of the resistive layer and a thin conductive metal layer.

Figure 1:
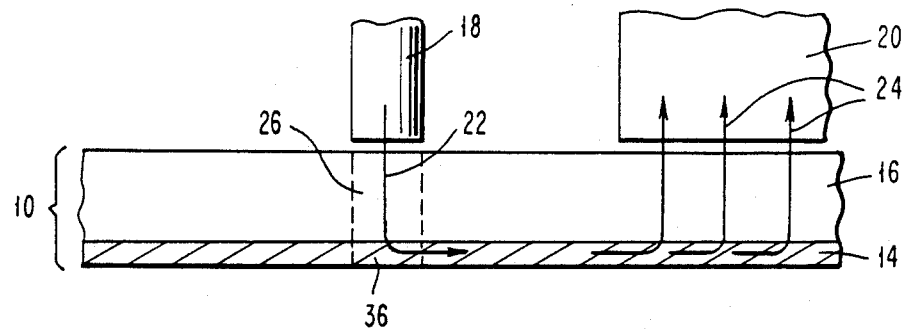
FIG. 1 depicts a transfer apparatus of the present invention, wherein electrical currents from a printing stylus pass through a resistive layer to coextensive regions of a metal layer causing localized heating which will melt or soften coextensive regions of a receiving substrate brought into contact with said metal and thereby enable the receiving substrate to pull away coextensive areas of the metal layer from the resistive ribbon.

FIG. 1 shows an apparatus for practicing the present invention where the metal transfer medium 10 is comprised of a resistive layer 16 and a metal layer 14. In order to direct electrical currents into the resistive layer 16, thereby heating the resistive layer which in turn locally transfers heat to the metal layer 14, a multistylus head of the type used n either resistive ribbon printing or electroerosion printing is provided. This type of head is well known in the art and is comprised of a plurality of printing styli 18 and a large contact (ground) electrode 20. When a select pattern of printing styli 18 is energized, electrical currents, represented by the arrows 22 will flow through the resistive layer and return to the ground electrode 20 via the metal conductive layer 14, as represented by arrows 24. If the current density is sufficiently high in the resistive layer regions in the vicinity of the printing stylus 18, intense resistive heating will occur and a small region 26 of the resistive layer 16 will conduct sufficient heat to coextensive region 36 in conjunction with heat generated in region 36 by the passage of electric current therethrough, to melt or sufficiently soften a coextensive region 30 (FIG. 2) of a softenable receiving layer in contact therewith so that the receiving layer will pull away the metal layer in that region. Current densities of about 20 to 50 mA, preferably about 25 to 35 mA are usable within the concepts of the present invention. The electrical current pulses will have durations of about 1 to 100 msec.

Figure 2:
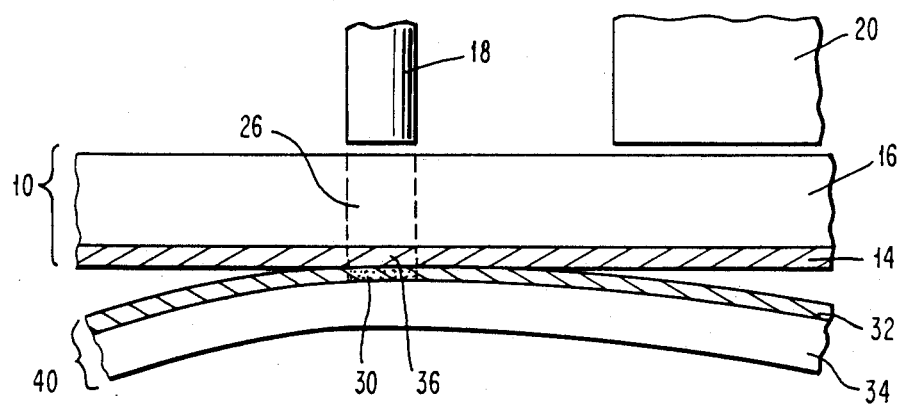
FIG. 2 depicts a detailed view of the transfer of a single metal indicia in accordance with the present invention.

In FIG. 2, the referece numerals 14, 16, 18, 20 and 36 depict the same elements as in FIG. 1. In FIG. 2, receiving sheet 40 comprises substrate 34 carrying a continuous metal receiving layer 32 of softenable high metal affinity material. Surface 32 is brought into contact with metal layer 14 while or shortly after the stylus or styli selected to heat area 26 have been sufficiently energized to provide a temperature within area 30 high enough so that a softening or melting of area 30 occurs as it contacts metal layer 14, whereby indicia 36 is transferred onto receiving layer 32 to provide an image thereon.

The resistive layer 16 has a resistivity similar to that of the relative layers in resistive printing ribbons, typically from about 200 to 1200 ohms/square. The resistive layer's thickness will depend upon its composition, since the resistive layer not only functions as a heat transfer means, but is self- supporting and also carries the metal layer. Thus, the resistive layer is selected so that it possesses sufficient physical integrity, including internal coherence, so that it can be fabricated into a continuus ribbon for passage through a resistive printing machine. In addition, the resistive layer must be of a character to withstand the physical and chemical abuse that will arise during whatever technique is employed to provide the metal thereon. This type of resistive layer is known in the art, since the art teaches resistive printing ribbons where an internal support is not employed, but the ribbons can consist of a polymer loaded with conductive particles. For example, a resistive layer can be formed of a polymer such as polycarbonate, polyetherimide, polyimide, polyester and so forth loaded with 15 to 40% (by weight) of a conductive particle such as carbon, graphite, nickel powder, nickel coated graphite, nickel coated mica and the like. Generally, a resistive layer having the thickness of about 10 to 30 micrometers will provide sufficient physical integrity for a flexible ribbon that can be provided with a cartridge for use with standard resistive printing equipment.

The metal layer can be provided on the resistive layer using conventional technology. Evaporation processes, such as vacuum evaporation, sputtering, electroless plating or metal electroplating are examples of operative techniques enabling one to deposit a thin metal layer on a loaded polymer (resistive layer) substrate. Usable metals include nickel, copper, gold, aluminum, chromium and so on. The metal layer will usually be of a thickness within the range of 300 to 1000 Å, although other thicknesses should be operable herein. The precise operating conditions for metallizing polymer substrates need not be recited herein since such is well known in the art.

The receptive or receiving substrate comprises a surface having a greater affinity for all or part of the thickness of the metal on the resistive layer due to melting or softening of said surface at the temperature generated in said resistive layer. A suitable substrate is a polymer film such as a polyester film (Mylar ® of Dupont is a commercially available polyester film) of any thickness. Other suitable receiving substrates are metallic, such as an aluminum or zinc plate, coated with a thin layer of heat meltable polymer.

Although not essential to the practice of this invention, it is possible to select a polymer support for use as a receiving layer which softens to some extent when brought into contact with the heated metal layer of the resistive ribbon. For example, preliminary experiments have indicated that a Mylar ® support can have its surface sufficiently softened by a thin evaporated aluminum layer provided on a resistive support and heated using a resistive printing apparatus so that the aluminum adheres to the Mylar ® without the need for an adhesive layer on the Mylar contacting surface. Routine experimentation can be employed to determine the relative adherence between the heated deposited metal and the resistive layer on the one hand and between the heated deposited metal and the receptive material on the other hand to determine whether or not a metal adhesive layer should usefully be applied to the receiving sheet. High temperature adhesives are well known, and such commercially available materials, for example, based on fluorocarbon polymer, polyvinyl butyral, polyamides, etc., can be applied as a surface layer to the receiving sheet. This technique is especially useful when the receiving sheet comprises a polymer which normally does not soften at the temperature reached by the transfer metal, such as polyimide or epoxy sheets. Where a polymer is used as a receiving layer, it is not necessary that it be the receiving support itself, but it can be provided on a support, such as on another polymer, on a metal, ceramic, etc.

Specific areas of application of the present invention are set forth below.

Offset printing is increasingly being accepted and used in the publishing business; every year its share in the printing industry is increased. The long run (greater than 100,000 impressions) offset plates presently in the market all use the lithography approach in which the image area is a photocrosslinked polymer on a metal (aluminum or zinc) substrate. Because the polymers which form the image area undergo mechanical and chemical wear in the offset press, the quality of the printing usually deteriorates late in the run. Using resistive ribbon technology as herein for fabrication of the offset plate will solve this problem, because the image area in this case is metallic which wears far slower than the polymers now used in offset lithography. As an example, a resistive ribbon is made from a resistive layer of polycarbonate- carbon composite and vacuum deposited with a thin layer of copper as shown in FIG. 2, by layers 16 and 14, respectively, to transfer metal indicia to a substrate 34 comprising an aluminum substrate coated with a thin layer of polyvinylmethylether maleic acid 32. The copper image is then electrolessly plated to a thickness of 2-3 micrometer. The plate is then mounted on an offset where the hydrophilic coating in the nonimage area is washed away by a fountain solution and the metal substrate is exposed. The master plate can be used to run thousands of impression without any deterioration of the image quality from the very first impression to the end of the run. Additionally examples of heat softenable hydrophilic polymer receiving layers re hydroxy-ethyl cellulose, hydroxypropyl cellulose and polyvinylpyrrolidone.

In another embodiment of this invention, the thin transfer metal layer is formed of more than one metal either as a single mixed metal layer or as a multiple layer, i.e., a dual layer where a second metal is deposited on a first metal. For example, a first thin copper layer is applied by vacuum evaporation to the resistive layer, followed by a thin layer of chromium metal applied by sputtering or vacuum evaporation. The chromium adds far greater adhesiveness to a polyester receiving layer for the copper imagery. As another example of the dual layer metal technique, a very thin layer of aluminum is applied by vacuum evaporation to the resistive layer followed by deposition of a thin layer of copper over the aluminum using the same deposition technique. When transfer is carried out, the transer of the metal to the substrate is much cleaner, and in this case a copper image with a very thin layer of aluminum thereon is transferred to the substrate. The aluminum is removable by a basic solution to leave copper imagery as used in the manufacture of printed circuit boards, the receiver in such case being an insulating material such as Kapton ® or Aramid fiber papers (Nomex ®). Since the transfer copper image will be very thin (200 to 1000 Å), the entire image can be thickened to say 5 to 20 micrometers, using a standard electroless plating process.

In another embodiment of the invention, a dielectric is provided at the resistive layer - metal layer interface, whereby the temperature at the interface is increased during the transfer process. For this purpose a thin dielectric layer (50 to 200 Å) can be coated on the resistive layer or a dielectric such as a fluorinated compound, i.e., fluorographite, which migrates to the surface upon drying, can be incorporated directly into the resistive layer. An example of a thin dielectric layer would be aluminum oxide. Variations of the invention will be apparent to the skilled artisan.

We claim:

1. A method for transferring a metal image to a softenable receiving layer, which method comprises:
    locating a multi-stylus recording head capable of providing electrical current pulses in selected ones of said recording styli in contact with a resistive layer of a metal thermal transfer medium comprising said resistive layer and thereon a thin metal layer;
    applying electrical current pulses through selected ones of said recording styli to produce high density localized currents in the regions of said resistive layer in contact with said selected energized styli, said electrical currents providing resistive heating in the regions of said metal layer about coextensive with said resistive layer regions;
    contacting said metal regions with said softenable receiving layer while providing sufficient heating by means of said resistive heating in the regions of said metal layer about coextensive with said receiving substrate to soften said about coextensive regions of said receiving substrate to transfer at least a portion of the thickness of said metal regions to said receiving layer.

2. The method of claim 1 wherein said electrical current have magnitudes in the range of about 20 to 50 mA.

3. The method of claim 1 wherein said electrical current pulses have durations of about 1 to 100 msec.

4. The method of claim 1 wherein said resistive layer has a thickness in the range of about 10 to 30 micrometers.

5. The method of claim 1 wherein said resistive layer comprises a self-supporting layer of a polymer binder loaded with conductive particles.

6. The method of claim 5 wherein said polymer comprises polycarbonate, polyetherimide, polyimide or polyester.

7. The method of claim 6 wherein said conductive particles comprise carbon, graphite, nickel powder, nickel coated graphite or nickel coated mica.

8. The method of claim 5 wherein said metal layer comprises aluminum, copper, chromium, gold or nickel.

9. The method of claim 8 wherein said metal layer comprises aluminum.

10. The method of claim 8 wherein said metal layer is a dual layer of two different metals.

11. The method of claim 10 wherein said dual layer comprises chromium over copper or copper over aluminum.

12. The method of claim 5 wherein said receiving layer comprises a polymer.

13. The method of claim 12 wherein said receiving layer comprises polyester.

14. The method of claim 12 wherein said receiving layer is an insulating substrate suitable for a use as a printed circuit board.

15. The method of claim 12 wherein said receiving layer is on a metal surface.

16. The method of claim 15 wherein said receiving layer is hydrophilic.

17. The method of claim 16 wherein said hydrophilic receiving layer is removed in areas to which said metal regions are not transferred.

18. The method of claim 12 wherein said receiving layer carries a coating comprising a metal affinity enhancing material.

19. The method of claim 16 wherein said metal affinity enhancing material is a glue.

20. The method of claim 1 carried out as a continuous process.

21. An apparatus for metal transfer comprising:
    a transfer medium comprised of a resistive layer and a thin metal layer thereon;
    a receiving medium comprised of a heat softenable receiving surface; and
    a multi-stylus recording head for providing patterns of electrical current through selected regions of said resistive layer, where said electrical currents are localized in the regions of said resistive layer contacted by the styli which are energized by said electrical currents, said localized electrical currents being sufficiently dense to provide sufficient resistive heating to regions of said metal layer about coextensive with said selected regions of said resistive layer, to soften coextensive regions of said heat softenable receiving surface when brought into contact with said metal layer.

* * * * *